US010765026B2

(12) United States Patent
Adrian

(10) Patent No.: US 10,765,026 B2
(45) Date of Patent: Sep. 1, 2020

(54) AUTOMATED DATA CENTER

(71) Applicant: Microsoft Technology Licensing, LLC, Redmond, WA (US)

(72) Inventor: Jason David Adrian, Woodinville, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 18 days.

(21) Appl. No.: 16/168,708

(22) Filed: Oct. 23, 2018

(65) Prior Publication Data

US 2020/0060033 A1 Feb. 20, 2020

Related U.S. Application Data

(60) Provisional application No. 62/719,522, filed on Aug. 17, 2018.

(51) Int. Cl.
*H05K 5/02* (2006.01)
*H05K 7/14* (2006.01)

(52) U.S. Cl.
CPC ......... *H05K 5/0286* (2013.01); *H05K 7/1487* (2013.01); *H05K 7/1492* (2013.01); *H05K 7/1494* (2013.01)

(58) Field of Classification Search
None
See application file for complete search history.

(56) References Cited

U.S. PATENT DOCUMENTS 6,738,811 B1   5/2004   Liang
7,725,212 B2   5/2010   Prasse
(Continued)

FOREIGN PATENT DOCUMENTS

CN   104850118 A   8/2015
CN   108243247 A   7/2018
(Continued)

OTHER PUBLICATIONS

"5m MTP 62.5/125 OM1 Multimode PVC Fiber Optic Cable—Orange", Retrieved From: https://www.cablestogo.com/product/31412/5m-mtp-62.5-125-om1-multimode-pvc-fiber-optic-cable-orange, Retrieved on: Oct. 10, 2018, 3 Pages.
"Molex 24 Fiber", Retrieved From: https://www.molex.com/webdocs/datasheets/pdf/en-us/1066011150_FIBER_OPTIC_CONNEC.pdf, Apr. 10, 2018, 1 Page.
"Application As Filed in U.S. Appl. No. 16/038,449", filed Jul. 18, 2018, 64 Pages.
(Continued)

*Primary Examiner* — Xanthia C Cunningham
(74) *Attorney, Agent, or Firm* — Alleman Hall Creasman & Tuttle LLP

(57) ABSTRACT

A server node is provided that includes a processor and a network interface controller mounted in a chassis configured to be inserted into a server node slot of a server node grid. The chassis includes a blind-mate connector system on a back side that includes a blind-mate power connector and a blind-mate network connector configured to blind-mate with a corresponding blind-mate power connector and a corresponding blind-mate network connector of the server node slot of the server node grid. As the server node is inserted into the server node slot, the blind-mate power connector is configured to blind-mate with the corresponding blind-mate power connector of the server node slot before the blind-mate network connector blind-mates with the corresponding blind-mate network connector of the server node slot, such that the blind-mate power connector provides alignment guidance for the blind-mate network connector.

20 Claims, 12 Drawing Sheets

(56) References Cited

U.S. PATENT DOCUMENTS

| | | |
|---|---|---|
| 9,429,944 B2 | 8/2016 | Filippov et al. |
| 9,597,801 B2 | 3/2017 | Morrill et al. |
| 2003/0081386 A1* | 5/2003 | Robillard ........... H01R 13/6315 361/724 |
| 2004/0243280 A1 | 12/2004 | Bash et al. |
| 2005/0047258 A1 | 3/2005 | Starr et al. |
| 2005/0286235 A1 | 12/2005 | Randall et al. |
| 2007/0094535 A1 | 4/2007 | Prasee |
| 2008/0080865 A1* | 4/2008 | Muro ................... H04J 14/0204 398/83 |
| 2010/0179695 A1 | 7/2010 | Collins et al. |
| 2013/0135805 A1* | 5/2013 | Wang ...................... G06F 1/185 361/679.02 |
| 2013/0335907 A1 | 12/2013 | Shaw et al. |
| 2014/0185225 A1 | 7/2014 | Wineland |
| 2015/0120971 A1* | 4/2015 | Bae ....................... G06F 3/0626 710/106 |
| 2017/0191822 A1* | 7/2017 | Becker ................. H05K 999/99 |
| 2018/0025299 A1 | 1/2018 | Kumar et al. |

FOREIGN PATENT DOCUMENTS

| | | |
|---|---|---|
| WO | 2013070104 A1 | 5/2013 |
| WO | 2016053323 A1 | 4/2016 |

OTHER PUBLICATIONS

Moss, Sebastian, "Startup Proposes Robotic Data Centers With No Humans", Retrieved From: https://www.datacenterdynamics.com/news/startup-proposes-robotic-data-centers-with-no-humans/, Jul. 26, 2016, 2 Pages.

Russo, et al., "A Novel Cloud-Based Service Robotics Application to Data Center Environmental Monitoring", In Journal of Sensors, vol. 16, Issue 8, Aug. 8, 2016, pp. 1-18.

Wang, et al., "Towards Optimal Sensor Placement for Hot Server Detection in Data Centers", In Proceedings 31st International Conference on Distributed Computing Systems, Jun. 20, 2011, 11 Pages.

"International Search Report and Written Opinion Issued in PCT Application No. PCT/US19/038812", dated Sep. 17, 2019, 15 Pages.

\* cited by examiner

US 10,765,026 B2

AUTOMATED DATA CENTER

CROSS REFERENCE TO RELATED APPLICATIONS

This application claims priority to U.S. Provisional Patent Application Ser. No. 62/719,522, filed Aug. 17, 2018, the entirety of which is hereby incorporated herein by reference for all purposes.

BACKGROUND

Demands for server and storage volumes continue to increase as the cloud market continues to scale. However, correspondingly scaling the hardware infrastructures of data centers becomes increasingly difficult. For example, finding suitable data center locations that are still available, scaling the technician workforce in those data centers, and handling the sudden spikes in data center component repairs, replacements, updates, and additions become increasingly challenging.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A server node is provided. The server node may include a processor and a network interface controller mounted in a chassis configured to be inserted into a server node slot of a server node grid. The chassis may include a blind-mate connector system on a back side that includes a blind-mate power connector and a blind-mate network connector configured to blind-mate with a corresponding blind-mate power connector and a corresponding blind-mate network connector of the server node slot of the server node grid. As the server node is inserted into the server node slot, the blind-mate power connector may be configured to blind-mate with the corresponding blind-mate power connector of the server node slot before the blind-mate network connector blind-mates with the corresponding blind-mate network connector of the server node slot, such that the blind-mate power connector may provide alignment guidance for the blind-mate network connector.

DETAILED DESCRIPTION

Demands for server and storage volumes continue to increase as the cloud market continues to scale. However, correspondingly scaling the hardware infrastructures of data centers becomes increasingly difficult. For example, suitable data center locations that have sufficient network and power infrastructure, a suitable environmental climate, tax code, etc., are limited. Locating new suitable data center locations may become increasingly challenging as more data centers are built. Additionally, scaling the technician workforce to manage those data center locations effectively is also difficult. Further, increases to hardware infrastructure of the data centers also increases the likelihood of events that cause sudden spikes in component repairs, replacements, updates, and additions to meet capacity that need to be efficiently addressed.

In addition to these scaling challenges, typical data centers that utilize racks of server nodes frequently require technicians to travel throughout the data center to service the server nodes. A large portion of a technician's time may typically be spent traveling back and forth through the data center. Typically, rack systems are assembled and tested at a 3rd party systems integrator, which may potentially increase costs and server deployment times. Further, hardware failures in a rack, such as a top-of-rack switch failure, may potentially impact every server node within the rack.

Figure 1:
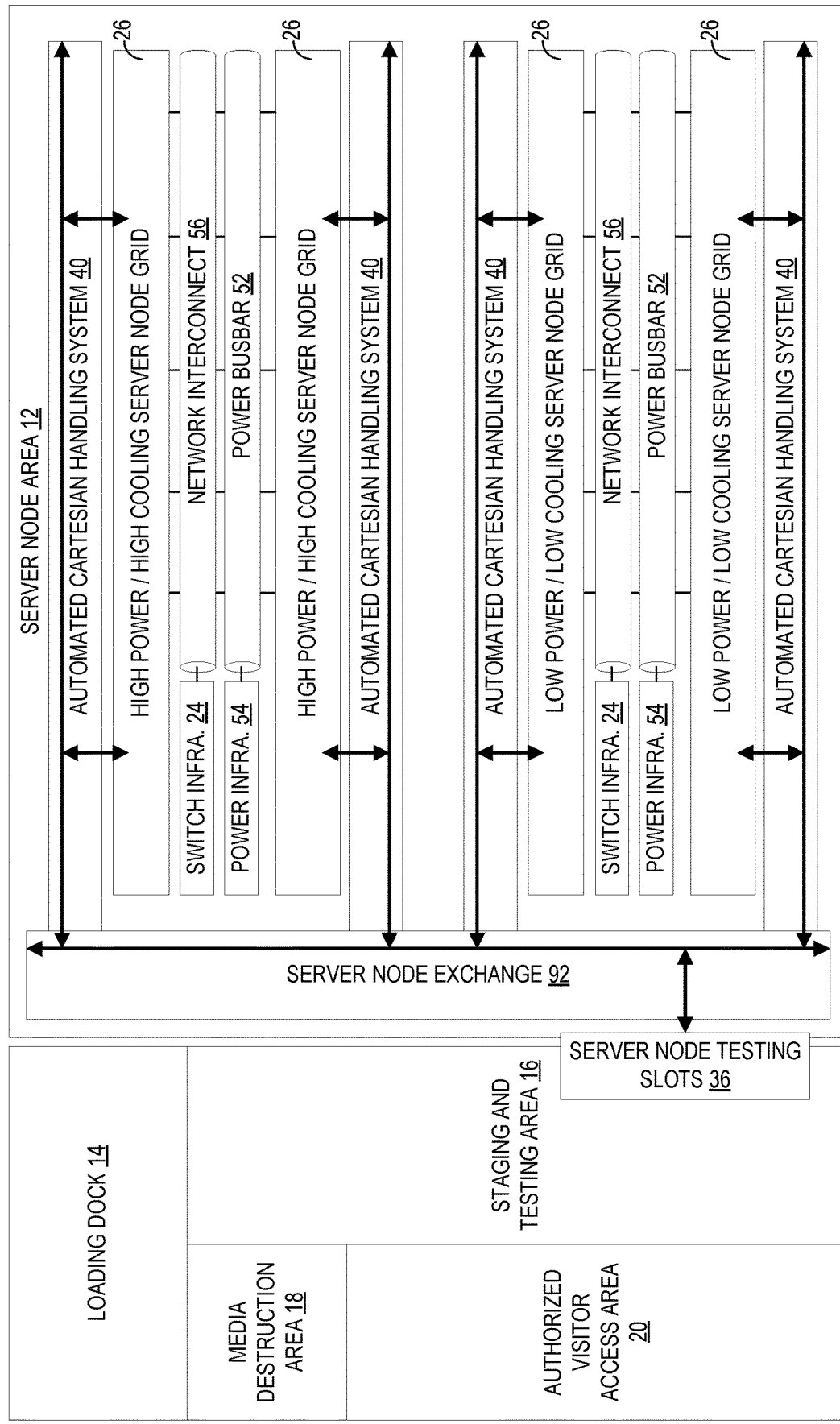
FIG. 1 shows an example layout of a data center that includes a plurality of server nodes that are deployed by an automated cartesian handling system.

To address the challenges discussed above, a data center that utilizes an automated cartesian handling system to deploy and extract server nodes individually is provided. FIG. 1 illustrates a schematic layout for a data center 10. The data center 10 may include several different areas, such as, for example, a server node area 12, a loading dock 14, a staging and testing area 16, a media destruction area 18, and an authorized visitor access area 20. The server node area 12 includes data center infrastructure for providing support, power, and network connection for a plurality of server nodes 22. The staging and testing area 16 may include tools, spare server node parts, and testing equipment for technicians to prepare the server nodes 22 received at the loading dock 14 for deployment to the server node area 12. The media destruction area 18 may include tools for handling customer data and storage drives according to service-level agreements (SLA), such as, for example, crushing the storage drives of decommissioned server nodes. The authorized visitor access area 20 may provide a controlled and secure area for 3rd party technicians or other authorized visitors to access the data center. It should be appreciated that the layout of the data center 10 illustrated in FIG. 1 is merely exemplary, and that the data center 10 may include other types of layouts and areas.

Figure 2:
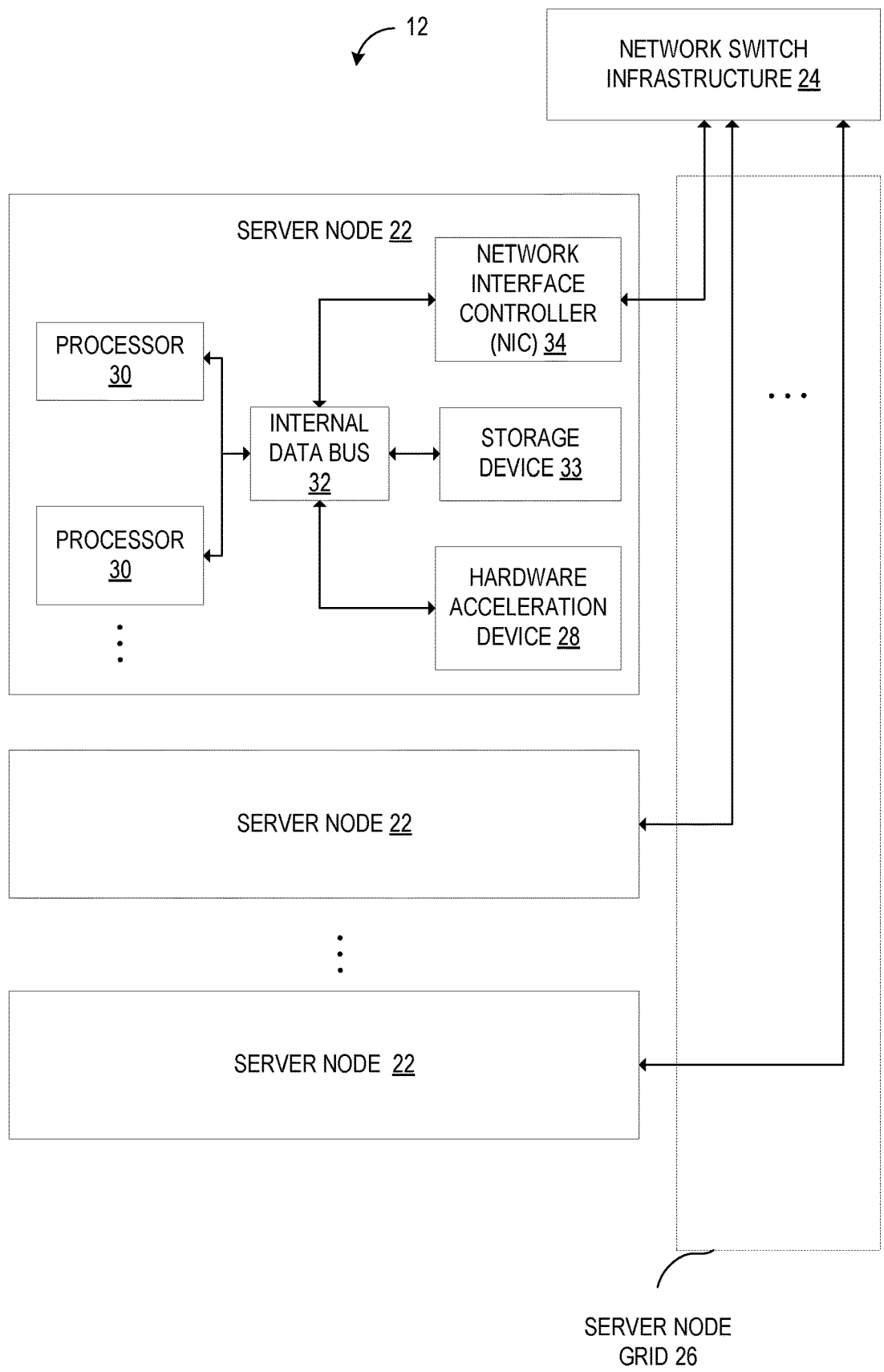
FIG. 2 shows a schematic view of an example server node of FIG. 1.

FIG. 2 illustrates an example plurality of server nodes 22 deployed in a data center environment of the server node area 12 that communicatively couples the plurality of server nodes 22 via network switch infrastructure 24. Each server node 22 may be individually and separately deployed to a server node grid 26 that provides physical structural support, a power connection, and one or more network connections such as, for example, ethernet connections or other types of protocol/interconnects to the network switch infrastructure 24 communicatively coupling the plurality of server nodes 22. The server node grid 26 may further provide ventilation and cooling for the deployed server nodes 22.

As illustrated in FIG. 2, each server node 22 in the server may, for example, include a hardware acceleration device 28, a processor 30, and a storage device 33 communicatively coupled to the hardware acceleration device 28 by an internal data bus 32. As shown, each server node 22 may include more than one processor 30. The more than one processors may for example, each execute separate host server virtual machines, or may collectively execute a single host server virtual machine. In one example, the internal data bus 32 may take the form of a Peripheral Component Interconnect Express (PCIe) link, for example. Data buses of other formats may alternatively be used. It will be appreciated that "internal" as used in the term "internal data bus" refers to the fact that at least a portion of the data bus is typically housed in the same housing (which serves as a Faraday cage) as the processor of the server, and should be understood to encompass a data bus that connects a processor of the server node in a housing with an internally mounted hardware acceleration component plugged into a PCIe slot on a circuit board of the server as one example, or to an externally coupled hardware acceleration component plugged into, e.g., a PCIe port on an external surface of the housing of the server. As illustrated, the hardware acceleration device 28 is also indirectly coupled to the processor 30 via a network interface controller (NIC) 34 that is also coupled to the processor 30 by an internal data bus 32, which, for example, may comprise one or more internal data buses as subcomponents. It should be appreciated that the example server node 22 is merely exemplary, and that other server components and layouts may also be utilized.

Turning back to FIG. 1, individual server nodes 22 may be separately and individually deployed to the server node area 12. In one example, as each server node 22 may be individually deployed rather than being clustered in a server rack with other server nodes, the data center 10 does not require a 3rd party system integrator that would typically integrate a plurality of server nodes into a server rack. Instead, server nodes 22 may be shipped to the data center 10 and received at the loading dock 14 directly, thus potentially saving time and reducing costs. Typically, the 3rd party system integrator also performs "burn-in" testing on the cluster of server nodes being integrated into a server rack by the 3rd party system integrator. In the example illustrated in FIG. 1, as server nodes are shipped directly from the manufacturer/assembler to the data center 10, "burn-in" testing of the server nodes 22 may be performed at the staging and testing area 16 of the data center 10 rather than at a 3rd party system integrator.

The staging and testing area 16 may include tools, spare server node parts, and testing equipment for technicians to prepare the server nodes 22 received at the loading dock 14 for deployment to the server node area 12. In one example, the staging and testing area 16 may include server node testing slots 36 that server nodes 22 may be inserted into for testing. After a server node 22 has been inserted into a server nose testing slot 36, that server node 22 may be exercised with a "burn-in" testing process to verify a stability and integrity of the server node. The "burn-in" testing process may, for example, force certain failures to occur under controlled conditions and parameters to establish a reliability of the server node 22. It should be appreciated that other processes may also be enacted on the server node 22 while the server node 22 is inserted in the server node testing slots 36.

Figure 3:
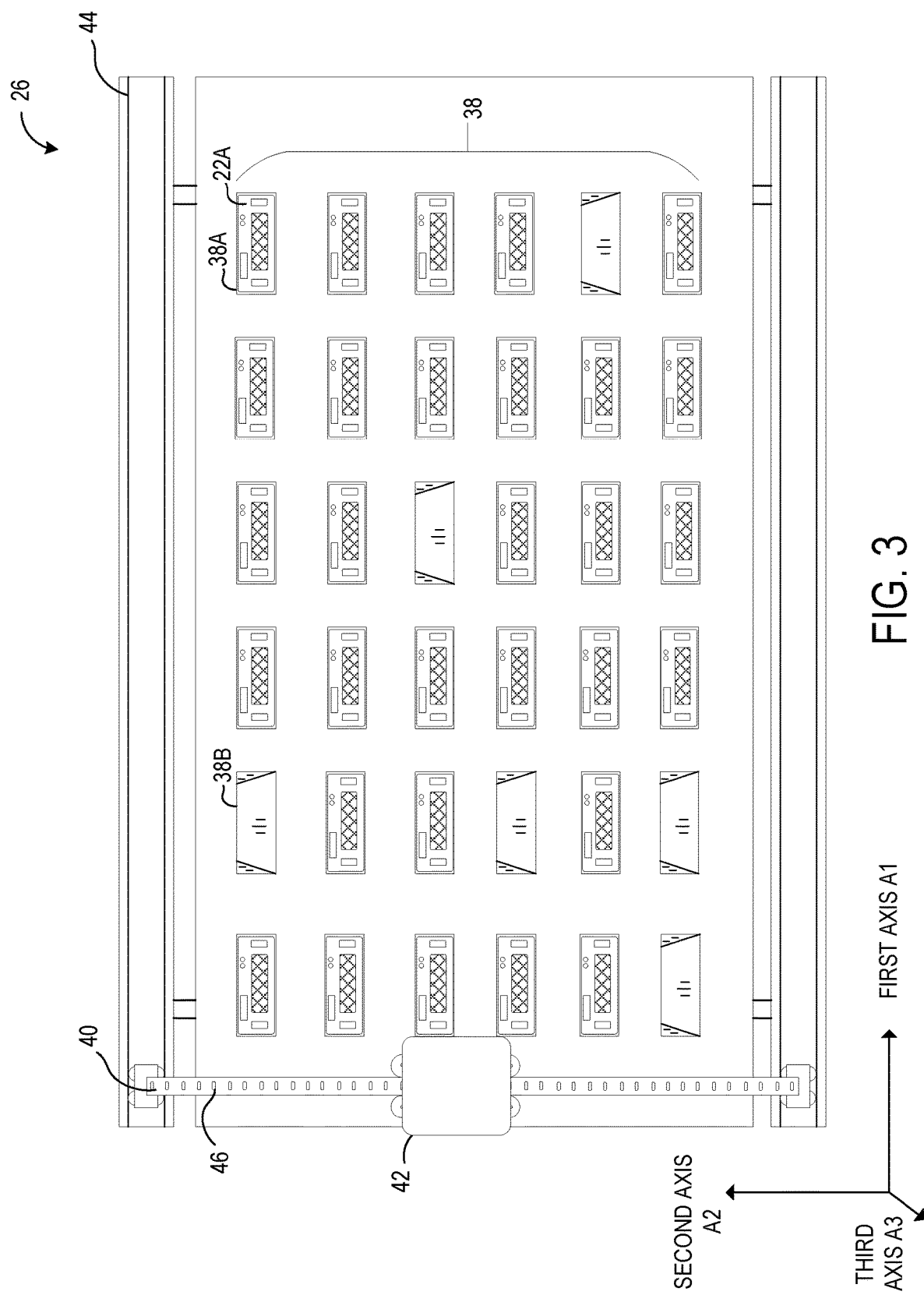
FIG. 3 shows a schematic view of a server node grid and an automated cartesian handling system of FIG. 1.

After the server node 22 has passed the "burn-in" testing processes, as well as any other suitable procedures, the server node 22 may be deployed to a server node grid 26 in the server node area 12. FIG. 3 illustrates an example server node grid 26 having a plurality of rows and columns of server node slots 38. In the illustrated example, a plurality of server nodes 22 have been deployed to the server node grid 26 and inserted into server node slots 38. For example, an example server node 22A has already been inserted into an example server node slot 38A. On the other hand, another example server node slot 38B is available, and does not currently contain a server node 22. Thus, another server node 22 may be deployed to the another example server node slot 38B.

As illustrated in FIG. 3, the server node grid 26 may have an attached automated cartesian handling system 40 configured to individually deploy server nodes 22 to the plurality of server node slots 38 of the server node grid 26. For example, the automated cartesian handling system 40 may be configured to insert a new server node into the empty server node slot 38B. The automated cartesian handling system 40 is also be configured to individually extract server nodes 22 from the plurality of server node slots 38 of the server node grid 26. For example, the automated cartesian handling system 40 may be configured to mechanically secure to the example server node 22A and pull the example server node 22A out of the example server node slot 38A. After extracting a server node, the automated cartesian handling system 40 may be configured to move and insert the extracted server node into a different server node slot 22, move the extracted server node to the staging and testing area 16, or move the extracted server node to another location.

As illustrated in FIG. 3, the automated cartesian handling system 40 includes a mechanical interface 42 that is configured to move along a first axis A1 and a second axis A2 via a rail system 44. The mechanical interface 40 may include a gripper mechanism, a spreader mechanism, or another type of mechanical mechanism configured to secure to a receiving interface of the server nodes 22. After securing to a server node 22, the mechanical interface 42 of the automated cartesian handling system 40 may move the secured server node 22 along the first axis A1 and second axis A2. As illustrated, the first axis A1 is perpendicular to the second axis A2. The mechanical interface 42 may move along the first axis A1 via the railing system 44 which guides the mechanical interface 42 along the first axis A1. The mechanical interface 42 may move along the second axis A2 via a spanning railing system 46 that extends between the railing system 44. In this manner, the mechanical interface 42 may move to any target position in the plane of the server node grid 26. The target position may be defined as having an X coordinate along the first axis A1 and a Y coordinate along the second axis A2. It should be appreciated that the mechanical interface 42 may be moved or propelled along the rail system 44 and spanning rail system 46 via any suitable method, such as, for example, a pneumatic movement system, a wheel and motor system, a track conveyer system, or any other suitable movement system.

Figure 4B:
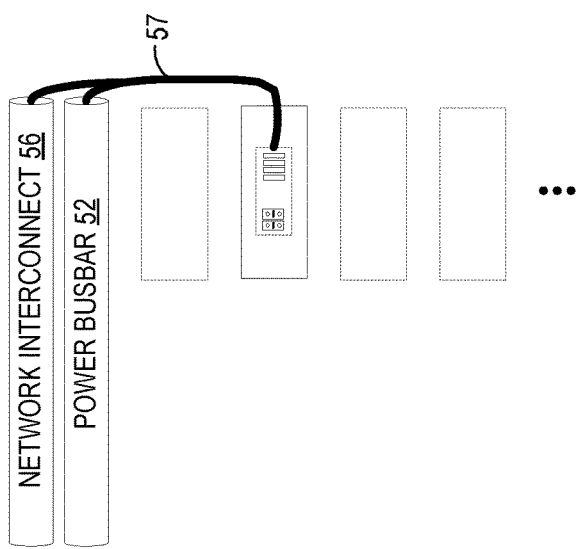
FIG. 4B shows a schematic view of a combined power and network cable assembly of the server node grid of FIG. 4A.
Figure 4A:
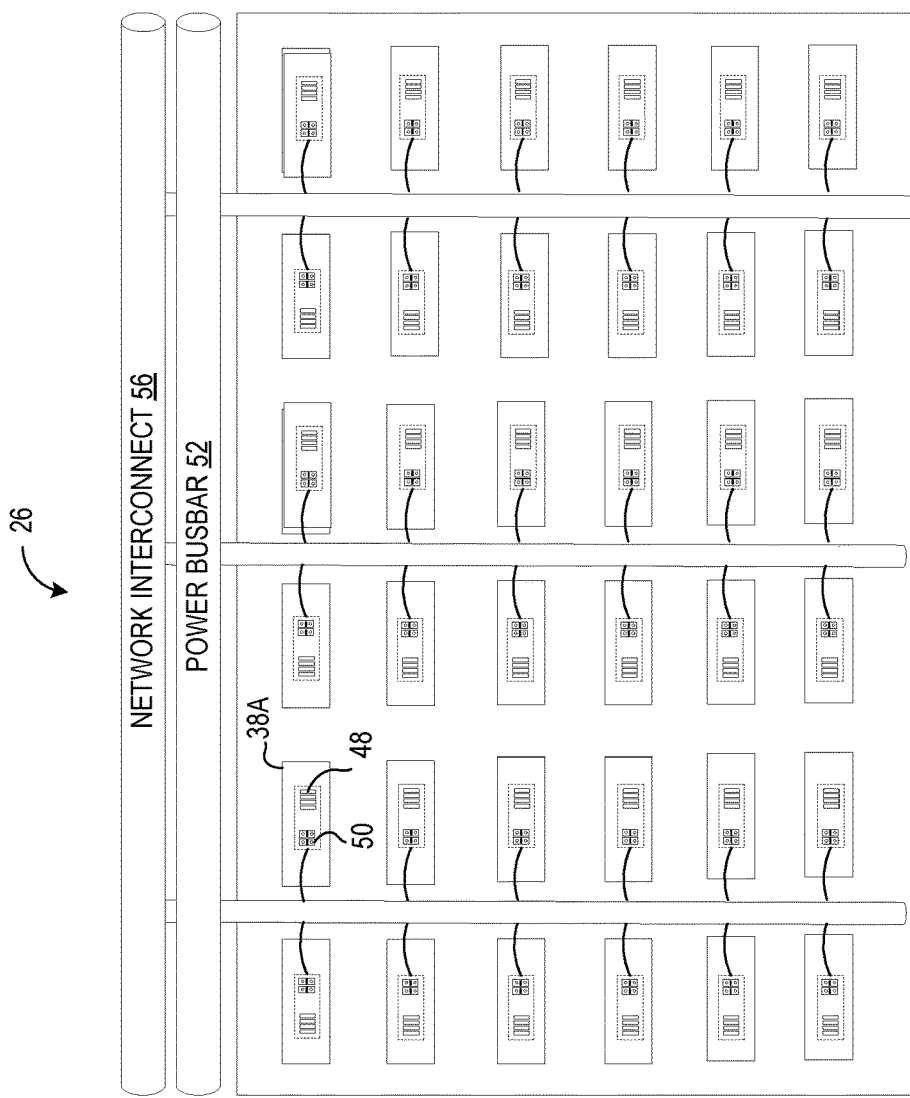
FIG. 4A shows a schematic view of a backside of the server node grid of FIG. 3.

FIG. 4 illustrates a back side of the server node grid 26. In this example, each server node slot 38 has a blind-mate power connector 48 and a blind-mate network connector 50. The blind-mate power connector 48 and the blind-mate network connector 50 are positioned on a back-wall inside of each server node slot 38. The blind-mate connector 48 and the blind-mate network connector 50 are configured to blind-mate with a corresponding blind-mate power connector and a corresponding blind-mate network connector positioned on a chassis of each of the server nodes 22. The blind-mate power connector 48 of each server node slot 38 is connected to a power busbar 52 that provides direct current power from power infrastructure 54 of the data center 10. The blind-mate network connector 50 of each server node slot 38 is connected to a network interconnect 56 that connects the blind-mate network connector 50 of each server node slot 38 to the network switch infrastructure 24. In one example, the blind-mate network connector 50 of each server node slot 38 is an optical network connector. The optical network connector may include fiber-optic cables that are communicatively coupled to the network switch infrastructure 24 via the network interconnect 56.

In typical data centers, top-of-rack switches are positioned in each server rack. Thus, if the top-of-rack switch of a server rack fails, a technician is required to travel to that particular server rack to repair the top-of-rack switch, which may potentially consume technician time. However, in the example illustrated in FIGS. 1 and 4, the network switch infrastructure 24 may be located at separate locations from the server node grids 26, and communicatively coupled to the server nodes 22 via the blind-mate network connector 50 and the network interconnect 56. Thus, if there are any network switch failures, technicians may repair those failures at the network switch infrastructure 24 which may be located near the staging and testing area 16 close to the technicians in the data center 10. In this manner, all of the network switch infrastructure 24 in the data center 10 may be positioned near the technicians.

In another example, the network switch infrastructure 24 may take a server node form factor. That is, the network switch infrastructure 24 may be included in a chassis like the chassis 58 of the server nodes 22 shown in FIG. 5 and described below. The server node form factor network switch infrastructure may also include blind-mate power connector, and blind-mate network connector, and other suitable blind-mate connectors on a back side of the chassis. In this example, the server node form factor network infrastructure may be deployed to a network switch slot that includes corresponding blind-mate power connectors and blind-mate network connectors by an automated cartesian handling system 40 according to the same processes as the server nodes 22. In this manner, deployment and extraction of the server node form factor network infrastructure may be automated. Nodes of the server node form factor network infrastructure may be deployed and extracted individually by the automated cartesian handling system 40.

In one example, the cabling for the blind-mate power connector 48 and the blind-mate network connector 50 may be combined in the same assembly. FIG. 4B shows an example combined power and network cabling assembly 57. In this example, cabling from the network interconnect 56 and the power busbar 52 may be included in the combined power and network cabling assembly 57 that connects to the back side of each server node slot 38 to route both the blind-mate power connector 48 and the blind-mate network connector 50 to the network switch infrastructure 24 and the power infrastructure 54. In another example, the blind-mate power connector 48 and the blind-mate network connector 50 may be separated into different assemblies.

Figure 5:
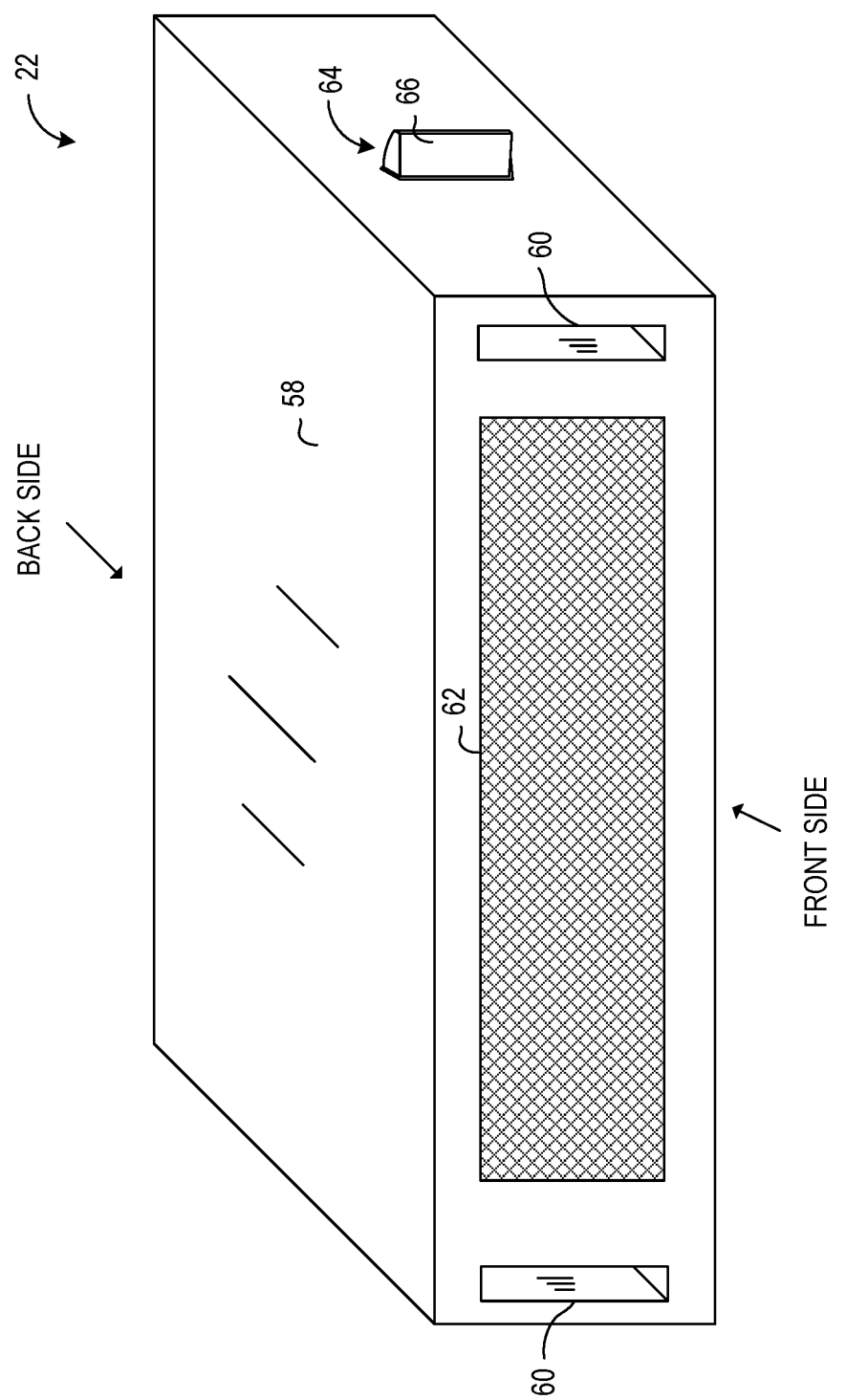
FIG. 5 shows a frontside view of an example server node of FIG. 1.

FIG. 5 illustrates an example server node 22. As discussed above, the example server node may be included in a plurality of server nodes 22 configured to be individually deployed to the plurality of server node slots 38 of the server node grid 26. The server node 22 includes a chassis 58 that provides support and housing for the computer components of the server node 22. For example, the server node 22 may include a processor 30 and a network interface controller 34 mounted in the chassis 58. It should be appreciated that other server components may also be mounted in the chassis 58, such as, for example, a hardware acceleration device 28, additional processors, etc.

As shown in FIG. 5, the chassis 58 includes a receiving interface 60 on a front side configured to secure to a mechanical interface 42 of the automated cartesian handling system 40. In the illustrated example, the receiving interface 60 comprises two slots formed in the chassis 58 that are configured to receive mechanical gripping arms of the mechanical interface 42 of the automated cartesian handling system 40. That is, mechanical gripping arms of the mechanical interface 42 may slid into the slots of the receiving interface 60 of the server node 22 and grip the chassis 58 to secure to the server node 22. However, it should be appreciated that other types of receiving interfaces 60 and securing configuration may be utilized for the server node 22. In one example, the server node 22 further comprises a ventilation opening 62 configured to allow cooling air to travel through the inside of the server node 22. The ventilation opening 62 may include a grill or cover with a perforated metal electromagnetic interference (EMI) shielding.

It should be appreciated that the receiving interfaces 60 described above are merely exemplary, and that other types of securing interfaces may be utilized. For example, the receiving interface 60 may be located on an outside of the chassis 58, and the mechanical interface 52 of the automated cartesian handling system may secure to the receiving interface 60 positioned on the outside of the chassis 58 of the server node 22.

In the example illustrated in FIG. 5, the chassis 58 of the server node 22 may further include a latching system 64 configured to reversibly secure to the server node slot 38 of the server node grid 26 when the server node 22 is inserted into the server node slot 38 by the cartesian handling system 40. In one example, the latching system 64 may include a pin 66 that may slide and extend outward from the chassis 58 of the server node 22 via a spring mechanism.

Figure 6:
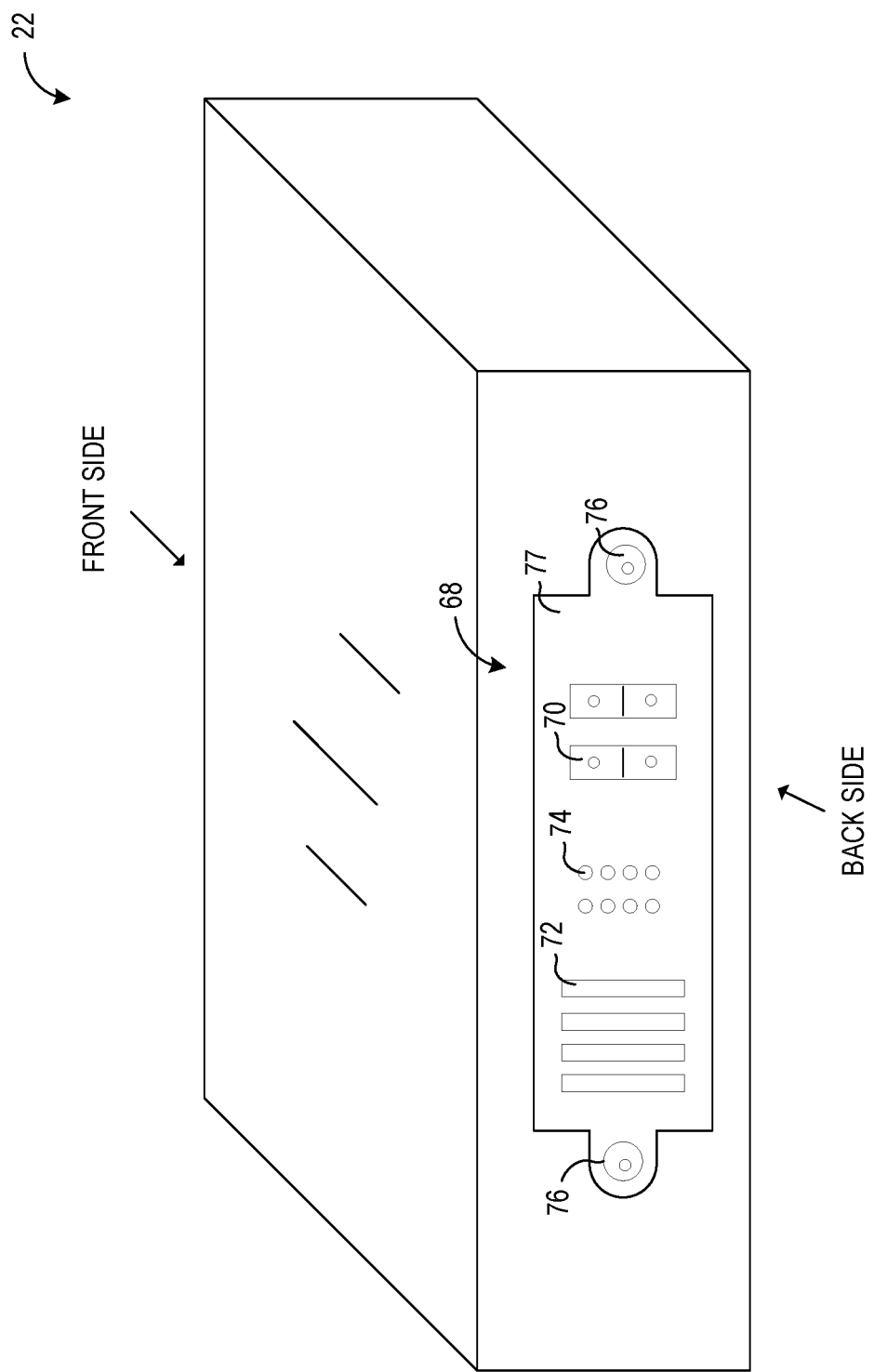
FIG. 6 shows a backside view of the example server node of FIG. 5.

FIG. 6 illustrates a back side view of the chassis 58 of the server node 22. As illustrated, the chassis 58 includes a blind-mate connector system 68 on a back side that includes a blind-mate power connector 70 and a blind-mate network connector 72 that correspond to blind-mate power connector 48 and blind-mate network connector 50 of the server node slots 38. It should be appreciated that the blind-mate connector system 68 may include other types of blind-mate connectors. For example, the blind-mate connector system 68 may further include one or more blind-mate in/out data connectors 74, which may correspond to one or more blind-mate in/out data connectors additionally included in each server node slot 38 in this example. The blind-mate connector system 68 may further include blind-mate aligning pins 76 configured to blind-mate with a corresponding interface in the server node slot 38 to guide the blind-mate connector system 68 and align the blind-mate power and network connectors. However, it should be appreciated that other types of blind-mate aligning and guidance systems may also be utilized for the blind-mate connector system 68.

In one example, the blind-mate power connector 72 and the blind-mate network connector 70 are arranged on a same plate 77 of the blind-mate connector system 68 in a single blind-mate connector assembly. The one or more blind-mate in/out data connectors 74 may also be arranged on the same plate 77 of the blind-mate connector system 68. In this example, the blind mate power connector 72, the blind-mate network connector 70, and the one or more blind-mate in/out data connectors 74 may be positioned at predetermined locations on the same plate 77 and arranged with predetermined distances and locations relative to one another. The corresponding blind-mate connectors of the server node slots may have complementary arrangements. In this manner, the blind-mate connector system 68 may be attached to different chassis designs and types of server nodes 22 constructed by different manufacturers, and ensure that those different chassis designs and types of server nodes 22 may blind-mate connect with the server node slots.

Figure 7:
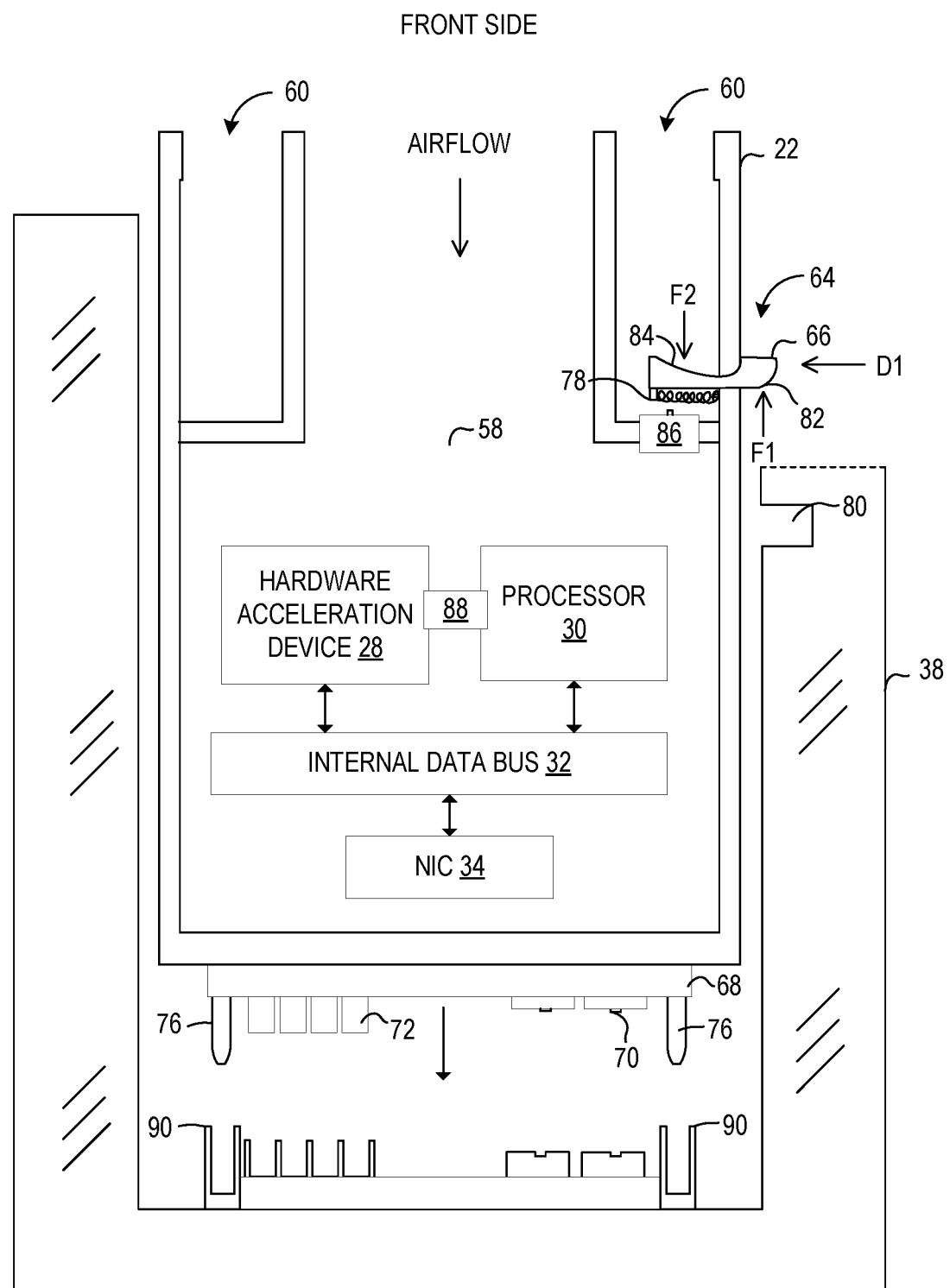
FIG. 7 shows an overhead schematic view of a server node being inserted into a server node slot in the data center of FIG. 1.

FIG. 7 illustrates an overhead cut-out view of a server node 22 being inserted into a server node slot 38. The server node 22 includes one or more processors 30 and a network interface controller 34 mounted in the chassis 58. As illustrated, the server node 22 may include other computer components, such as, for example, one or more hardware acceleration devices 28, a non-volatile memory device, a volatile memory device, an internal data bus 32, etc. The server node 22 is configured to be inserted into a server node slot 38 of a server node grid 26 by an automated cartesian handling system 40. To securely interface with the automated cartesian handling system 40, the chassis 58 includes a receiving interface 60 on a front side configured to secure to the mechanical interface 42 of the automated cartesian handling system 40. In the illustrated example, the receiving interface 60 comprises two slots configured to receive two arms of the mechanical interface 42 such that the mechanical interface 42 may grip and secure to the receiving interface 60 of the chassis 58 of the server node 22.

The server node 22 further includes the latching system 64 configured to reversibly secure to the server node slot 38 of the server node grid 26 when the server node 22 is inserted into the server node slot 38 by the cartesian handling system 40. In the illustrated example, the latching system 64 includes the pin 66 that slides and extends outward from the chassis 58 of the server node 22 via a spring mechanism 78. When the spring mechanism 78 is at a neutral position, the pin 66 extends outward from the chassis 58. The pin 66 is configured to slot into a latch receiving structure 80 of the server node slot 38. In this example, the latch receiving structure 80 is a slot in a wall of the server node slot 38 that is configured to receive the pin 66 of the latching system 64.

As the server node 22 is inserted into the server node slot 38 by the automated cartesian handling system 40, a rounded side 82 of the pin 66 of the latching system 64 contacts a side of the server node slot 38. A force F1 applied to the rounded side 82 of the pin 66 causes the pin 66 to be pressed inward in the direction D1. In this manner, as the server node 22 is inserted into the server node slot 38, the pin 66 is pressed inward into the chassis 58, placing tension on the spring mechanism 78. When the server node 22 is fully inserted into the server node slot 38, the pin 66 is positioned at the latch receiving structure 80 of the server node slot 38. As there is no longer a force being applied from the wall of the server node slot 38 onto the pin 66, the tensioned spring mechanism 78 forces the pin 66 to extend into the latch receiving structure 80 to thereby reversibly secure the server node 22 to the server node slot 38. To disengage the latching system 64 from the latch receiving structure 80 of the server node slot 38, a force F2 may be applied to an angled portion 84 of the pin 66 to thereby cause the pin 66 to move inward in the direction D1. In this manner, the pin 66 may be forced back inward into the chassis 58 of the server node 22 and disengaged from the latch receiving structure 80 of the server node slot 38, allowing the server node 22 to be extracted from the server node slot 38. It should be appreciated that the latch system 66 illustrated in FIG. 7 and described above is merely exemplary, and that other types of latching systems 66 other than a pin latch may be utilized by the server nodes 22.

In one example, the server node 22 may further include a latch sensor 86 configured to detect whether the latching system 66 is secured to the server node slot 38 of the server node grid 26. In the illustrated example, the latch sensor 86 may be configured to detect a position of the pin 66 to determine whether the ping 66 is currently extended outward from the chassis 58 or retracted inward. If the pin 66 is extended outward and the server node 22 has been inserted into the server node slot 38, then the latch sensor 86 may determine that the latch system 66 is currently secured to the server node slot 38. It should be appreciated that other types of latch sensors 86 may be utilized to detect whether the latch system 66 is secured to the latch receiving structure 80 of the server node slot 38.

The server node 22 may further include other types of sensor devices. In one example, the server node 22 may include a temperature sensor 88 configured to detect a temperature of the server node 22. The temperature sensor 88 may be positioned near the processor 30 and/or the hardware acceleration device 28 and be configured to measure a temperature of the processor 30 and/or the hardware acceleration device 28. In another example, the temperature sensor 88 may be configured to measure an average internal temperature of the server node 22. The processor 30 of the server node 22 may be configured to send the detected temperature and the detected state of the latching system 66 to a server management system of the data center 10 via the blind-mate network connector 70.

As the server node 22 is being inserted into the server node slot 38, the walls of the server node slot 38 provide gross guidance and alignment for the blind-mate connector system 68 to blind-mate with the corresponding blind-mate connectors on the back wall of the server node slot 38. Next, the blind-mate aligning pins 76 of the blind-mate connector system 68 are inserted into an aligning pin receiving structure 90 positioned on a backwall of the server node slot 38, which provide a finer guidance and alignment for the blind-mate connector system 68.

As the server node 22 is further inserted into the server node slot 38, the blind-mate connector system 68 is configured to blind-mate the blind-mate power connector 72 before the blind-mate network connector 70. The blind-mate power connector 72 typically has a higher misalignment tolerance than the blind-mate network connector 70, which may be an optical network connector for example. Thus, by positioning the blind-mate power connector 72 to mate with a corresponding connector at the back of the server node slot 38 before the blind-mate network connector 70, the blind-mate power connector 72 may provide additional guidance and alignment for the blind-mate network connector 70. In examples that include blind-mate in/out data connectors which also typically have a higher misalignment tolerance than the blind-mate network connector 70, the blind-mate in/out data connectors may also be positioned to mate with a corresponding connector at the back of the server node slot 38 before the blind-mate network connector 70, providing even finer guidance and alignment. As the server node 22 is fully inserted into the server node slot 38, the blind-mate network connector 70 mates with a corresponding connector at the back of the server node slot 38.

Figure 8:
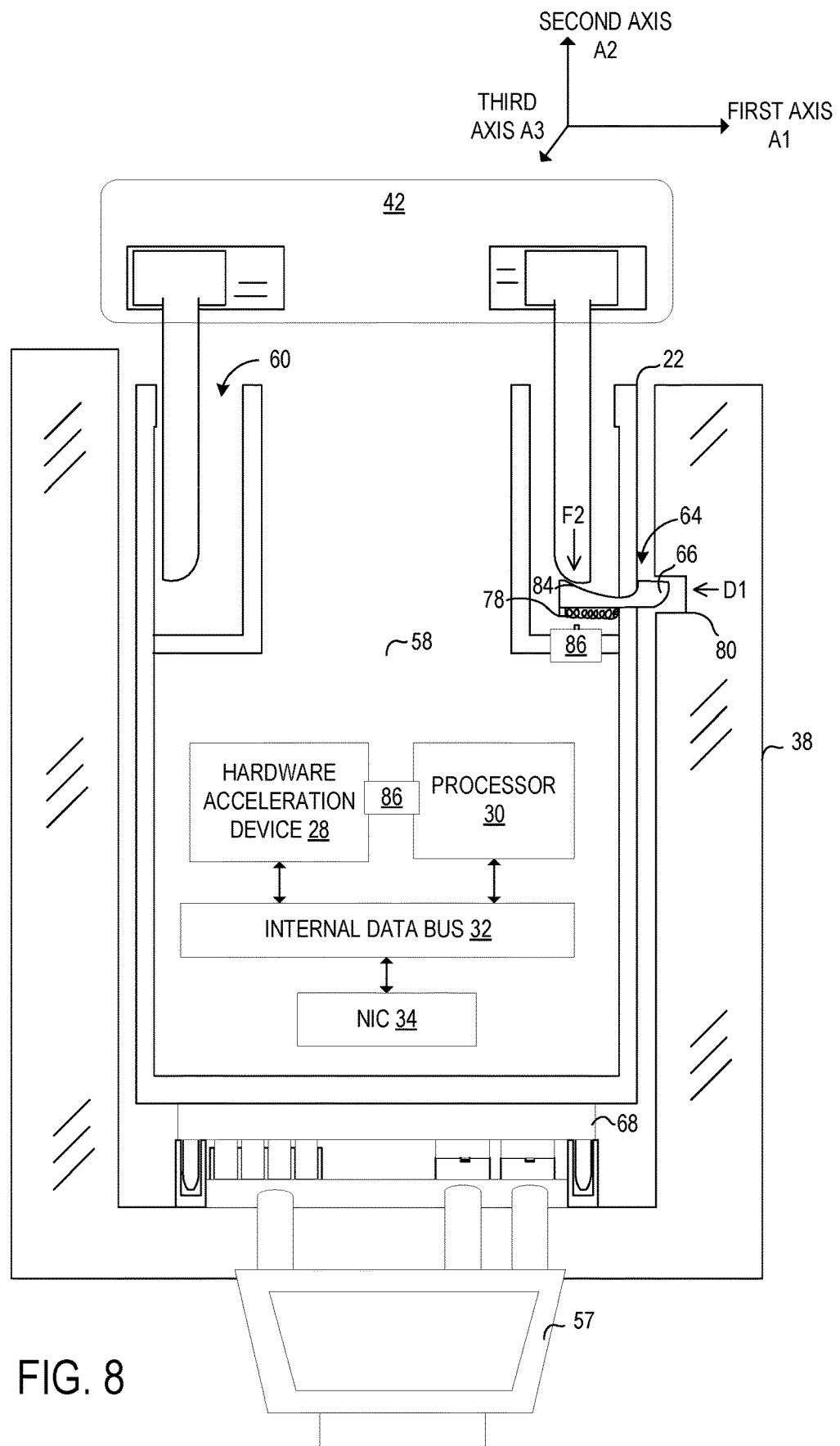
FIG. 8 shows an overhead schematic view of a server node fully inserted into a server node slot in the data center of FIG. 1.

FIG. 8 shows the example server node 22 illustrated in FIG. 7 in a fully inserted position. As shown, the server node 22 has been fully inserted into the server node slot 38 of the server node grid 26. The blind-mate connector system 68 is fully mated with the corresponding blind-mate connectors positioned on the backwall of the server node slot 38. The pin 66 of the latch mechanism 64 is secured to the latch receiving structure 80 of the server node slot 38. Thus, the server node 22 is provided with power and a network connection by the server node grid 26, and is fully secured within the server node slot 38 such that the server node 22 cannot fall out of the server node slot 38. In the illustrated example, cabling for the corresponding blind-mate connectors positioned on the backwall of the server node slot 38 may be connected to the network switch infrastructure 24 and the power infrastructure 54 via a combined power and network cabling assembly 57.

To extract the server node 22 from the server node slot 38, the mechanical interface 42 of the automated cartesian handling system 40 is configured to secure to a receiving interface 60 of the server node 22 to move the server node 22. The mechanical interface 42 may secure to the receiving interface 60 as described above by inserting into the receiving interface 60 of the server node 22 and gripping or otherwise securing to the chassis 58 of the server node 22. The mechanical interface 42 of the automated cartesian handling system 40 may be further configured to disengage the latching system 66 of a server node 22 while securing to the receiving interface 60 of the server node 22 and pull the server node 22 from the server node slot 38.

As described with reference to FIG. 7, the latching system 60 is configured to unlatch from the server node slot 38 of the server node grid 26 when the server node 22 is secured to the mechanical interface 42 of the cartesian handling system 40 for extraction from the server node slot 38. In the illustrated example, the latching system 60 may include the pin 66 which is retracted back into the chassis 58 in response to a force F2 applied to the angled portion 84 of the ping 66. In this example, the force F2 may be applied by a gripping arm of the mechanical interface 42 of the automated cartesian handling system 40 as the gripping arm is inserted into the receiving interface 60 of the server node 22. By pressing on the angled portion 84 of the pin 66 with the force F2, the gripping arm of the mechanical interface 42 cause the pin 66 to move in the direction D1 and thereby disengage from the latch receiving structure 80 of the server node slot 38.

After disengaging the latching mechanism 64 of the server node 22, and securing to the chassis 58 of the server node 22, the mechanical interface 42 is configured to move in a third axis A3 perpendicular to both the first axis A1 and second axis A2 to extract the server node 22 into the server node slot 38 of the server node grid 26. The mechanical interface 42 may conversely insert the server node 22 into the server node slot 38 by moving in an opposite direction along the third axis A3. As illustrated in FIGS. 3 and 8, the third axis is perpendicular to the first axis and second axis which lie on a plane of the server node grid 26. Thus, the third axis A3 is an axis that travels into the server node grid 26 front to back.

Figure 9:
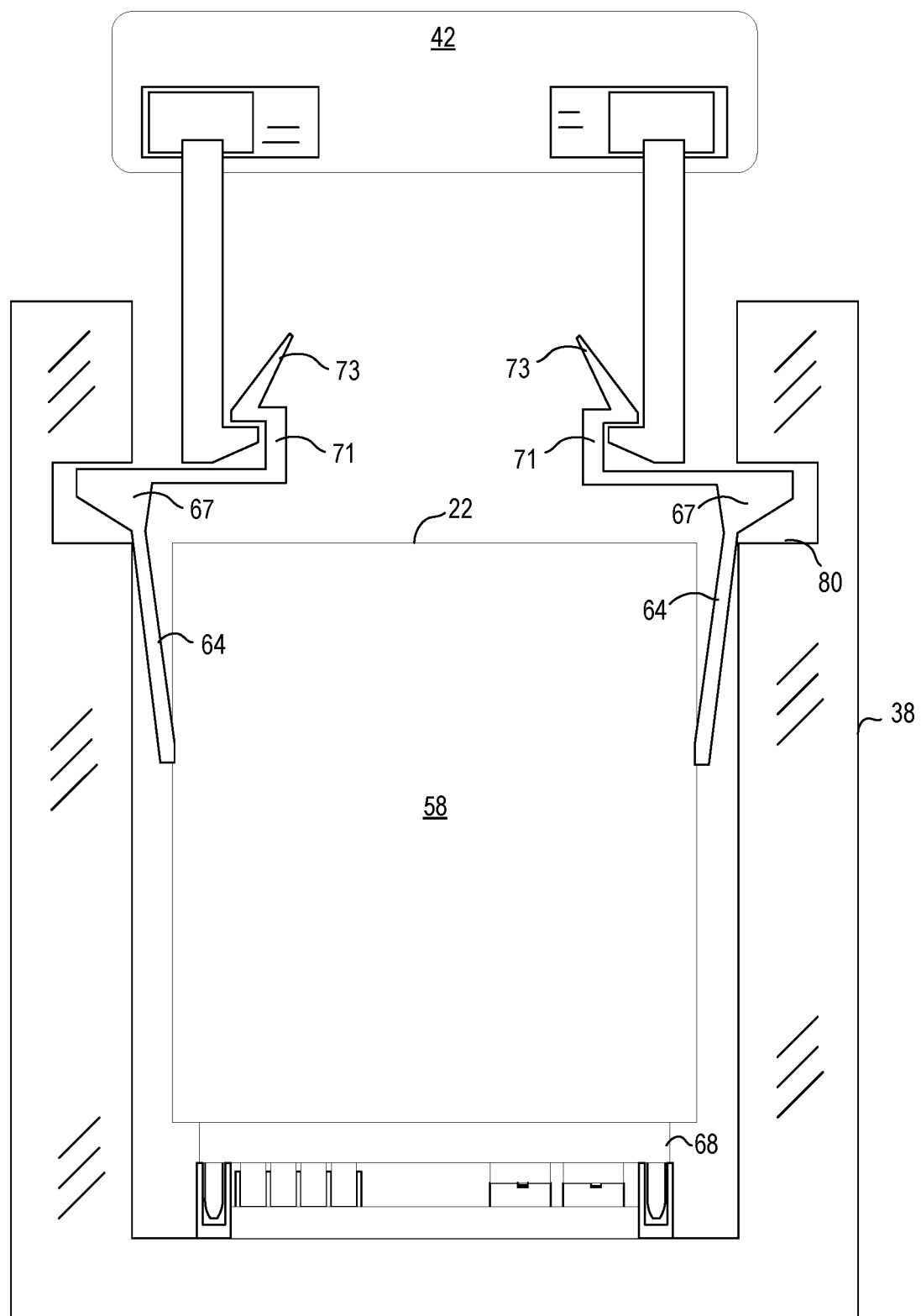
FIG. 9 shows an overhead schematic view of an engaged latching system of a server node inserted into a server node slot in the data center of FIG. 1.

The server nodes 22 may utilize other types of latching systems 60. FIG. 9 illustrates another example latching system 64 that may, for example, be formed from spring steel and configured to be actuatable by a mechanic interface 42 of the cartesian handling system 40 and by human technicians. In the example illustrated in FIG. 9, the latching system 64 may be mounted on the chassis 58 of the server node 22 and configured to reversibly secure to the server node slot 38 of the server node grid 26 when the server node 22 is inserted into the server node slot 38 by the cartesian handling system 40. In this example, the latching system 64 may include a protrusion 67 that may extend outward into a latch receiving structure 80 of the server node slot 38 when the latching system 64 is secured to the server node slot 38. To actuate the latching system 64 and disengage the protrusion 67 from the latch receiving structure 80 of the server node slot 38, the mechanical interface 42 and/or a human technician may engage with a receiving interface 71 of the latching system 64.

In the illustrated example, the receiving interface 71 of the latching system 64 illustrated in FIG. 9 may be formed to provide guidance for the mechanical interface 42 to secure to the receiving interface 71. For example, the receiving interface 71 may include a flange 73 or lip configured to guide the mechanical interface 42 into securing with the receiving interface 71. As illustrated in FIG. 9, the receiving interface 71 of the latching system 64 is located outside of the chassis 58 such that a human technician may also actuate the latching system 64 to disengage the latching system 64 from the latch receiving structure 80 of the server node slot.

Figure 10:
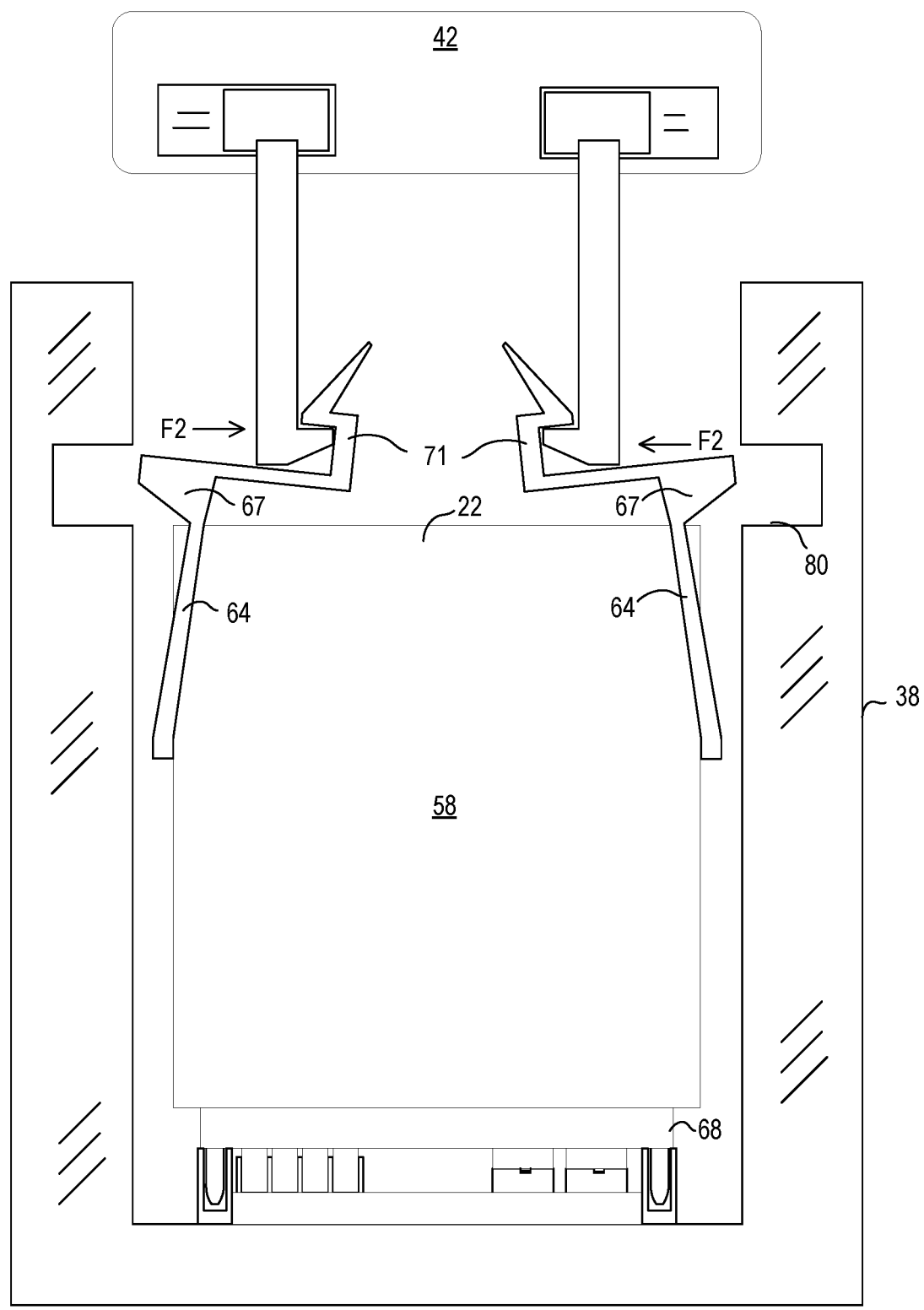
FIG. 10 shows an overhead schematic view of a disengaged latching system of a server node inserted into a server node slot in the data center of FIG. 1.

As illustrated in FIG. 10, after securing to the receiving interface 71 of the latching system 64, the mechanical interface 42 or a human technician may apply a force F2 to the receiving interface 71 to squeeze the latching system 64 and bend the spring steel inward away from the walls of the server node slot 38. In this manner, the protrusions 67 of the latching system 64 are disengaged from the latch receiving structures 80 of the server node slot 38. The mechanical interface 42 or the human technician may then pull the server node 22 from the server node slot 38 while maintaining the force F2 on the latching system 64.

Turning back to FIG. 1, the data center 10 may include a plurality of server node grids 26. In the illustrated example, the data center 10 includes two high power/high cooling server node grids and two low power/low cooling server node grids. Thus, server nodes having a lower usage may be deployed to the low power/low cooling server node grids, while server nodes having a high or otherwise strenuous usage may be deployed to the high power/high cooling server node grids. However, it should be appreciated that other types of server node grids 26 may be included in the plurality of server nodes grids 26 to organize the plurality of server nodes 22, such as, for example, medium power/medium cooling server node grids, etc.

Each of the server node grids 26 in the data center 10 may have an associated automated cartesian handling system configured to deploy server nodes 22 to that server node grid and extract server nodes 22 from that server node grid 26. In some example, it may be advantageous to move a particular server node from one server node grid to another. For example, if a particular server node is overheating due to excessive usage, it may be advantageous to move that server node to a server node grid that is set to provide an increased amount of power and cooling.

As illustrated in FIG. 1, to facilitate movement of server nodes between server node grids 26, the data center 10 may further include a server node exchange 92 configured to receive a server node 22 from a first automated cartesian handling system of a first server node grid and send the server node 22 to a second automated cartesian handling system of a second server node grid. For example, the server node exchange 92 may include server node slots similar to the server node grids, but without power and network connections. Thus, the automated cartesian handing systems of the plurality of server node grids 26 may be configured to insert server nodes 22 into the slots of the server node exchange 92 and extract server nodes 22 from the slots of the server node exchange 92 in a similar manner as described above. After a server node 22 has been inserted into a slot, the server node exchange 92 may be configured to move the slot and the contained server node 22 to a different location of the data center 10 via a conveyer system, rail system, pneumatic system, or another suitable type of movement system. In this manner, a server node 22 may be exchanged from a first server node grid to a second server node grid.

Figure 11:
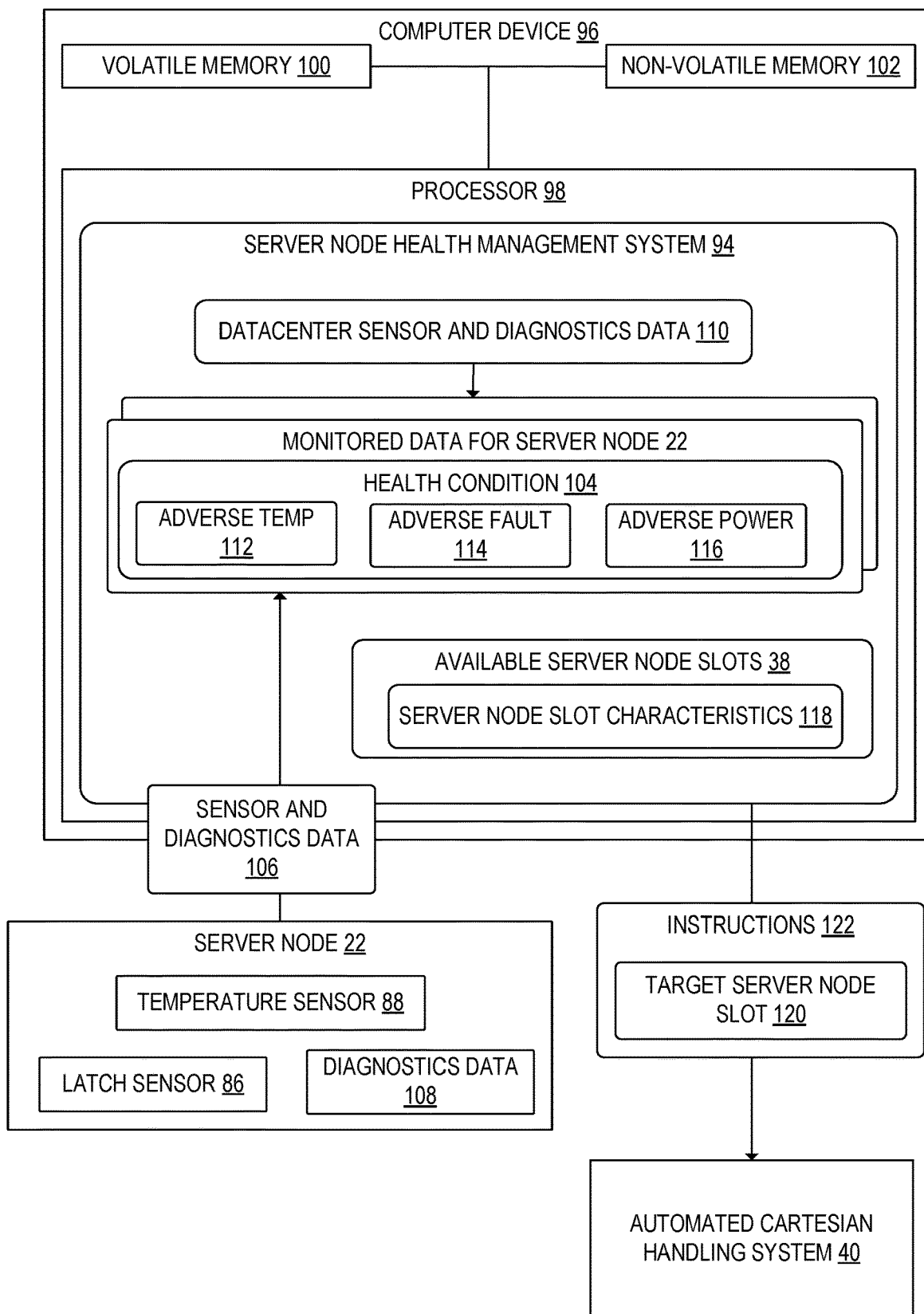
FIG. 11 shows an example server node health management system configured to manage distribution of server nodes in the data center of FIG. 1.

Distribution of the server nodes 22 among the server node grids 22 may be handed by a server node health management system 94. FIG. 11 illustrates an example computer device 96 configured to execute the server node health management system 94. The computer device 96 may be located in the data center 10, and may include a processor 98, volatile memory 100, non-volatile memory 102, and other suitable computer components. In one example, the computer device 96 may take the form of multiple computer devices configured to perform the functions of the server node health management system 94 in concert.

The server node health management system 94 executed by the processor 98 of the computer device 96 is configured to monitor a health condition 104 of a plurality of server nodes 22 deployed in a server node grid 26 having a plurality of server node slots 38. The server node health management system 94 may be configured to monitor the health condition 104 of the server nodes based on sensor and diagnostics data 106 received from each server node 22 via the network communicatively coupling the plurality of server nodes 22. The sensor and diagnostics data 106 may include temperature data captured by the temperature sensor 88 in the server node 22, latch sensor data detected by the latch sensor 86 in the server node 22, and other diagnostics data 108 captured by a processor of the server node 22, such as, for example, a load on the processor, software faults and errors, network connection, etc.

In one example, the server node health management system 94 may further gather data center sensor and diagnostics data 110 from sensors and other computer devices of the data center 10. For example, diagnostics data for the network switch infrastructure 24 and the power infrastructure 54 may be send to the server node health management system 94. As another example, each server node grid 26 may include a sensor suite configured to capture temperature data, network connection data, power usage data, and other types of diagnostics data for the server nodes deployed to that server node grid. Each server node grid 26 may send sensor data captured by its sensor suite to the server node health management system. It should be appreciated that the data center sensor and diagnostics data 110 described above are merely exemplary, and that other types of diagnostics data 110 may also be sent to the server node health management system 94.

Based on the sensor and diagnostics data 106 received from each sensor node 22, and the data center sensor and diagnostics data 110, the server node health management system 94 may track a health condition of each deployed server node 22. While monitoring the health conditions of the server nodes, the server node health management system 94 may be configured to detect an adverse health condition for one of the plurality of server nodes 22. The detected adverse health condition may include an adverse temperature condition 112, an adverse server node fault condition 114, an adverse power condition 116, or another type of adverse health condition. Based on detecting an adverse health condition for one of the plurality of server nodes 22, the server node health management system 94 may be configured to instruct an automated cartesian handling system 40 to individually move the one of the plurality of server nodes to a different server node slot based on the detected adverse health condition.

In one example, the server node health management system 94 is configured to detect available server node slots 38 in the server node grid 26 that do not currently have a server node 22 deployed to that server node slot 38. The server node health management system 94 may process the data center sensor and diagnostics data 110 to determine server node slot characteristics 118 for each of the available server node slots 38, such as, for example, a temperature, a magnitude of cooling/ventilation, a power characteristic, a network connection characteristic, or another suitable characteristic. In this example, the server node health management system 94 may be configured to identify a target server node slot 120 that mitigates the detected adverse health condition of the server node from the available server node slots 38. For example, if the detected adverse health condition is the adverse temperature condition 112, the server node health management system 94 may be configured to identify a server node slot having increased cooling as the target server node slot 120 based on the sever node slot characteristics 118. As another example, if the detected adverse health condition is the adverse server node fault condition 114, the server node health management system 94 may be configured to identify a testing server node slot 36 as the target server node slot 120. As yet another example, if the detected adverse health condition is the adverse power condition 116, the server node health management system 94 may be configured to identify a server node slot having increased power as the target server node slot 120. It should be appreciated that the examples of identifying a target server node slot 120 described above are merely exemplary, and that other methods of identifying a target server node slot may be utilized by the server node health management system 94.

In one example, the data center 10 being managed by the server node health management system 94 includes a plurality of server node grids. In this example, the server node health management system 94 may be configured to detect all available server node slots 38 across the plurality of server node grids. That is, in response to detecting an adverse health condition for a target server node deployed to a first server node grid, the server node health management system 94 may be configured to consider server node slots on a second server node grid for the target server node slot 120. Thus, in this example, the target server node slot 120 may be located on a different server node grid of a plurality of server node grids 26.

After the server node health management system 94 has identified a target server node slot 120 that mitigates the detected adverse health condition 104 of the server node, the server node health management system 94 may be configured to send instructions 122 to instruct the automated cartesian handling system 40 to individually move the one of the plurality of server nodes to the target server node slot 120. The server node may be extracted from its current server node slot by a mechanical interface 42 of the automated cartesian handling system 40 according to the methods described above. The mechanical interface 42 of the automated cartesian handling system 40 may then move along the first axis A1 and the second axis A2 along the plane of the server node grid 26 to reach a position of the target server node slot 120, and insert the server node into the target server node slot 120 according to the methods described above. In examples where the target server node slot 120 is located on a different server node grid, the instructions 122 sent by the server node health management system 94 may further include instructions for handing off the server node to the server node exchange 92 of the data center 10.

In some examples, the server nodes 22 may include one or more sub-modules that may be attached to the server nodes 22 to provide additional functionality. In these examples, the automated cartesian handling system 40 may be further configured to secure to these sub-modules and deploy or extract the sub-modules to each of the server nodes 22.

Additionally, it should be appreciated that the datacenter layout illustrated in FIG. 1 is scalable. That is, the server node area 12 of the datacenter 12 may be extended into additional areas. The existing datacenter 10 infrastructure may be efficiently scaled by extending the server node exchange 92 to reach into these additional areas, and adding new server node grids 26 having automated cartesian handling systems 40 in the additional areas. In the same manner as described above, new server nodes 22 may be deployed to the new server node grids 26 via the server node exchange 92 and the automated cartesian handling systems 40. Additionally, it should be appreciated that already deployed server nodes 22 from the original server nodes grids 26 may be redistributed to the new server nodes grids 26 according to the methods and processes described herein. In this manner, the datacenter 10 may be efficiently scaled and extended.

In some embodiments, the methods and processes described herein may be tied to a computing system of one or more computing devices. In particular, such methods and processes may be implemented as a computer-application program or service, an application-programming interface (API), a library, and/or other computer-program product.

Figure 12:
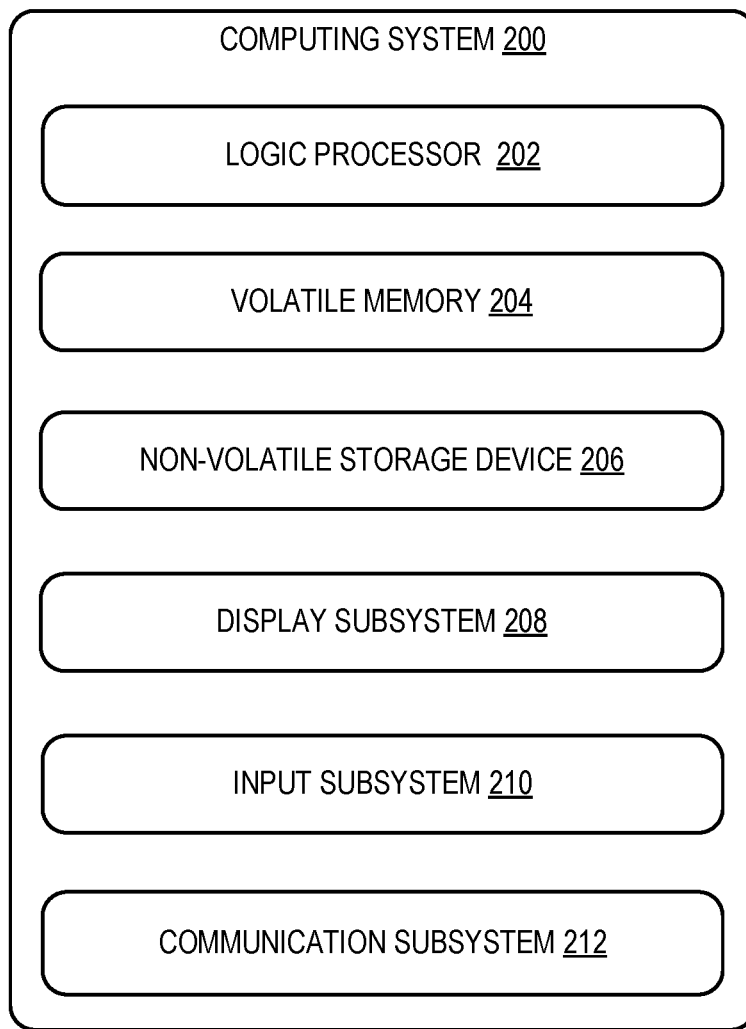
FIG. 12 shows a schematic view of an example computing environment in which the server nodes of the data center of FIG. 1 may be enacted.

FIG. 12 schematically shows a non-limiting embodiment of a computing system 200 that can enact one or more of the methods and processes described above. Computing system 200 is shown in simplified form. Computing system 200 may, for example, embody the server nodes 22, the computer device 96, or may instead embody some other computing system. Computing system 200 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented/virtual reality devices.

Computing system 200 includes a logic processor 202, volatile memory 204, and a non-volatile storage device 206. Computing system 200 may optionally include a display subsystem 208, input subsystem 210, communication subsystem 212, and/or other components not shown in FIG. 12.

Logic processor 202 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 202 may include one or more physical processors (hardware) configured to execute software instructions. Additionally or alternatively, the logic processor 202 may include one or more hardware logic circuits or firmware devices configured to execute hardware-implemented logic or firmware instructions. Processors of the logic processor 202 may be single-core or multi-core, and the instructions executed thereon may be configured for sequential, parallel, and/or distributed processing. Individual components of the logic processor 202 optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects may be run on different physical logic processors of various different machines.

Volatile memory 204 may include physical devices that include random access memory. Volatile memory 204 is typically utilized by logic processor 202 to temporarily store information during processing of software instructions. It will be appreciated that volatile memory 204 typically does not continue to store instructions when power is cut to the volatile memory 204.

Non-volatile storage device 206 includes one or more physical devices configured to hold instructions executable by the logic processors to implement the methods and processes described herein. When such methods and processes are implemented, the state of non-volatile storage device 206 may be transformed—e.g., to hold different data.

Non-volatile storage device 206 may include physical devices that are removable and/or built-in. Non-volatile storage device 206 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 206 may include nonvolatile, dynamic, static, read/write, read-only, sequential-access, location-addressable, file-addressable, and/or content-addressable devices. It will be appreciated that non-volatile storage device 206 is configured to hold instructions even when power is cut to the non-volatile storage device 206.

Aspects of logic processor 202, volatile memory 204, and non-volatile storage device 206 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system 200 implemented to perform a particular function. In some cases, a program may be instantiated via logic processor 202 executing instructions held by non-volatile storage device 206, using portions of volatile memory 204. It will be understood that different programs may be instantiated from the same application, service, code block, object, library, routine, API, function, etc. Likewise, the same program may be instantiated by different applications, services, code blocks, objects, routines, APIs, functions, etc. The term "program" encompasses individual or groups of executable files, data files, libraries, drivers, scripts, database records, etc.

When included, display subsystem 208 may be used to present a visual representation of data held by non-volatile storage device 206. As the herein described methods and processes change the data held by the non-volatile storage device 206, and thus transform the state of the non-volatile storage device 206, the state of display subsystem 208 may likewise be transformed to visually represent changes in the underlying data. Display subsystem 208 may include one or more display devices utilizing virtually any type of technology. Such display devices may be combined with logic processor 202, volatile memory 204, and/or non-volatile storage device 206 in a shared enclosure, or such display devices may be peripheral display devices.

When included, input subsystem 210 may comprise or interface with one or more user-input devices such as a keyboard, mouse, touch screen, or game controller. In some embodiments, the input subsystem 210 may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection, gaze detection, and/or intent recognition; as well as electric-field sensing componentry for assessing brain activity; and/or any other suitable sensor.

When included, communication subsystem 212 may be configured to communicatively couple computing system 200 with one or more other computing devices. Communication subsystem 212 may include wired and/or wireless communication devices compatible with one or more different communication protocols. As non-limiting examples, the communication subsystem 212 may be configured for communication via a wireless telephone network, or a wired or wireless local- or wide-area network. In some embodiments, the communication subsystem 212 may allow computing system 200 to send and/or receive messages to and/or from other devices via a network such as the Internet.

The following paragraphs provide additional support for the claims of the subject application. One aspect provides a server node comprising a processor and a network interface controller mounted in a chassis configured to be inserted into a server node slot of a server node grid. The chassis includes a blind-mate connector system on a back side that includes a blind-mate power connector and a blind-mate network connector configured to blind-mate with a corresponding blind-mate power connector and a corresponding blind-mate network connector of the server node slot of the server node grid. As the server node is inserted into the server node slot, the blind-mate power connector is configured to blind-mate with the corresponding blind-mate power connector of the server node slot before the blind-mate network connector blind-mates with the corresponding blind-mate network connector of the server node slot, such that the blind-mate power connector provides alignment guidance for the blind-mate network connector. In this aspect, additionally or alternatively, the blind-mate power connector and the blind-mate network connector may be arranged on a same plate of the blind-mate connector system. In this aspect, additionally or alternatively, the blind-mate connector system may further include one or more blind-mate in/out data connectors configured to blind-mate with corresponding one or more blind-mate in/out data connectors of the server node slot. In this aspect, additionally or alternatively, as the server node is inserted into the server node slot, the one or more blind-mate in/out data connectors may be configured to blind-mate with the corresponding one or more blind-mate in/out data connectors of the server node slot before the blind-mate network connector blind-mates with the corresponding blind-mate network connector of the server node slot, such that the one or more blind-mate in/out data connectors provide alignment guidance for the blind-mate network connector. In this aspect, additionally or alternatively, the server node may be configured to be inserted into the server node slot of the server node grid by an automated cartesian handling system, and the chassis may include a receiving interface on a front side configured to secure to a mechanical interface of the automated cartesian handling system. In this aspect, additionally or alternatively, the chassis may further include a ventilation opening on the front side. In this aspect, additionally or alternatively, the chassis may further include a latching system configured to reversibly secure to the server node slot of the server node grid when the server node is inserted into the server node slot by the cartesian handling system, and the latching system may be configured to unlatch from the server node slot of the server node grid when the server node is secured to the mechanical interface of the cartesian handling system for extraction from the server node slot. In this aspect, additionally or alternatively, the sever node may further include a latch sensor configured to detect whether the latching system is secured to the server node slot of the server node grid. In this aspect, additionally or alternatively, the blind-mate power connector may be an optical network connector. In this aspect, additionally or alternatively, the server node may further include a temperature sensor configured to detect a temperature of the server node.

Another aspect provides a server node comprising a processor and a network interface controller mounted in a chassis configured to be inserted into a server node slot of a server node grid. The chassis includes a blind-mate connector system on a back side that includes a blind-mate power connector and a blind-mate network connector configured to blind-mate with a corresponding blind-mate power connector and a corresponding blind-mate network connector of the server node slot of the server node grid. The blind-mate power connector and the blind-mate network connector are arranged on a same plate of the blind-mate connector system. In this aspect, additionally or alternatively, the blind-mate connector system may further include one or more blind-mate in/out data connectors configured to blind-mate with corresponding one or more blind-mate in/out data connectors of the server node slot, the one or more blind-mate in/out data connectors being arranged on the same plate of the blind-mate connector system. In this aspect, additionally or alternatively, as the server node is inserted into the server node slot, the blind-mate power connector may be configured to blind-mate with the corresponding blind-mate power connector of the server node slot before the one or more blind-mate in/out data connectors blind-mate with the corresponding one or more blind-mate in/out data connectors of the server node slot, and the one or more blind-mate in/out data connectors may be configured to blind-mate with the corresponding one or more blind-mate in/out data connectors of the server node slot before the blind-mate network connector blind-mates with the corresponding blind-mate network connector of the server node slot. In this aspect, additionally or alternatively, the server node may be configured to be inserted into the server node slot of the server node grid by an automated cartesian handling system, and the chassis may include a receiving interface on a front side configured to secure to a mechanical interface of the automated cartesian handling system. In this aspect, additionally or alternatively, the chassis may further include a ventilation opening on the front side. In this aspect, additionally or alternatively, the chassis may further include a latching system configured to reversibly secure to the server node slot of the server node grid when the server node is inserted into the server node slot by the cartesian handling system, and the latching system may be configured to unlatch from the server node slot of the server node grid when the server node is secured to the mechanical interface of the cartesian handling system for extraction from the server node slot. In this aspect, additionally or alternatively, the server node may further include a latch sensor configured to detect whether the latching system is secured to the server node slot of the server node grid. In this aspect, additionally or alternatively, the blind-mate power connector may be an optical network connector. In this aspect, additionally or alternatively, the server node may further include a temperature sensor configured to detect a temperature of the server node.

Another aspect provides a data center comprising a server node grid having a plurality of rows and columns of server node slots, each server node slot having a blind-mate power connector and a blind-mate network connector. The data center further includes a plurality of server nodes configured to be individually deployed to the plurality of server node slots, each server node having a corresponding blind-mate power connector and a corresponding blind-mate network connector positioned on a chassis thereof. The data center further includes an automated cartesian handling system configured to individually deploy server nodes to the plurality of server node slots and individually extract server nodes from the plurality of server node slots.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A server node comprising:
a processor and a network interface controller mounted in a chassis configured to be inserted into a server node slot of a server node grid;
wherein the chassis includes a blind-mate connector system on a back side that includes a blind-mate power connector and a blind-mate network connector configured to blind-mate with a corresponding blind-mate power connector and a corresponding blind-mate network connector of the server node slot of the server node grid; and
wherein as the server node is inserted into the server node slot, the blind-mate power connector is configured to blind-mate with the corresponding blind-mate power connector of the server node slot before the blind-mate network connector blind-mates with the corresponding blind-mate network connector of the server node slot, such that the blind-mate power connector provides alignment guidance for the blind-mate network connector.

2. The server node of claim 1, wherein the blind-mate power connector and the blind-mate network connector are arranged on a same plate of the blind-mate connector system.

3. The server node of claim 1, wherein the blind-mate connector system further includes one or more blind-mate in/out data connectors configured to blind-mate with corresponding one or more blind-mate in/out data connectors of the server node slot.

4. The server node of claim 3, wherein as the server node is inserted into the server node slot, the one or more blind-mate in/out data connectors are configured to blind-mate with the corresponding one or more blind-mate in/out data connectors of the server node slot before the blind-mate network connector blind-mates with the corresponding blind-mate network connector of the server node slot, such that the one or more blind-mate in/out data connectors provide alignment guidance for the blind-mate network connector.

5. The server node of claim 1, wherein the server node is configured to be inserted into the server node slot of the server node grid by an automated cartesian handling system; and
wherein the chassis includes a receiving interface on a front side configured to secure to a mechanical interface of the automated cartesian handling system.

6. The server node of claim 5, wherein the chassis further includes a ventilation opening on the front side.

7. The server node of claim 6, wherein the chassis further includes a latching system configured to reversibly secure to the server node slot of the server node grid when the server node is inserted into the server node slot by the cartesian handling system; and
wherein the latching system is configured to unlatch from the server node slot of the server node grid when the server node is secured to the mechanical interface of the cartesian handling system for extraction from the server node slot.

8. The server node of claim 7, further comprising a latch sensor configured to detect whether the latching system is secured to the server node slot of the server node grid.

9. The server node of claim 1, wherein the blind-mate network connector is an optical network connector.

10. The server node of claim 1, further comprising a temperature sensor configured to detect a temperature of the server node.

11. A server node comprising:
a processor and a network interface controller mounted in a chassis configured to be inserted into a server node slot of a server node grid by an automated cartesian handling system;
wherein the chassis includes a blind-mate connector system on a back side that includes a blind-mate power connector and a blind-mate network connector configured to blind-mate with a corresponding blind-mate power connector and a corresponding blind-mate network connector of the server node slot of the server node grid;

wherein the chassis includes a receiving interface on a front side configured to secure to a mechanical interface of the automated cartesian handling system; and wherein the blind-mate power connector and the blind-mate network connector are arranged on a same plate of the blind-mate connector system.

12. The server node of claim 11, wherein the blind-mate connector system further includes one or more blind-mate in/out data connectors configured to blind-mate with corresponding one or more blind-mate in/out data connectors of the server node slot, the one or more blind-mate in/out data connectors being arranged on the same plate of the blind-mate connector system.

13. The server node of claim 11, wherein as the server node is inserted into the server node slot, the blind-mate power connector is configured to blind-mate with the corresponding blind-mate power connector of the server node slot before the one or more blind-mate in/out data connectors blind-mate with the corresponding one or more blind-mate in/out data connectors of the server node slot; and wherein the one or more blind-mate in/out data connectors are configured to blind-mate with the corresponding one or more blind-mate in/out data connectors of the server node slot before the blind-mate network connector blind-mates with the corresponding blind-mate network connector of the server node slot.

14. The server node of claim 1, wherein the chassis further includes a ventilation opening on the front side.

15. The server node of claim 14, wherein the chassis further includes a latching system configured to reversibly secure to the server node slot of the server node grid when the server node is inserted into the server node slot by the cartesian handling system; and wherein the latching system is configured to unlatch from the server node slot of the server node grid when the server node is secured to the mechanical interface of the cartesian handling system for extraction from the server node slot.

16. The server node of claim 15, further comprising a latch sensor configured to detect whether the latching system is secured to the server node slot of the server node grid.

17. The server node of claim 11, wherein the blind-mate network connector is an optical network connector.

18. The server node of claim 11, further comprising a temperature sensor configured to detect a temperature of the server node.

19. A data center comprising:
a server node grid having a plurality of rows and columns of server node slots, each server node slot having a blind-mate power connector and a blind-mate network connector;
a plurality of server nodes configured to be individually deployed to the plurality of server node slots, each server node having a corresponding blind-mate power connector and a corresponding blind-mate network connector positioned on a chassis thereof, and
an automated cartesian handling system configured to individually deploy server nodes to the plurality of server node slots and individually extract server nodes from the plurality of server node slots.

20. The data center of claim 19, wherein as a server node of the plurality of server nodes is inserted into a server node slot, the blind-mate power connector of the server node slot is configured to blind-mate with the corresponding blind-mate power connector of the server node before the blind-mate network connector of the server node slot blind-mates with the corresponding blind-mate network connector of the server node, such that the blind-mate power connector provides alignment guidance for the blind-mate network connector.

* * * * *